United States Patent
Kang et al.

(10) Patent No.: US 8,017,929 B2
(45) Date of Patent: Sep. 13, 2011

(54) PHASE CHANGE MATERIAL LAYERS AND PHASE CHANGE MEMORY DEVICES INCLUDING THE SAME

(75) Inventors: Youn-seon Kang, Seoul (KR); Daniel Wamwangi, Aachen (DE); Matthias Wuttig, Aachen (DE); Ki-joon Kim, Hwaseong-si (KR); Yoon-ho Khang, Yongin-si (KR); Cheol-kyu Kim, Seoul (KR); Dong-seok Suh, Seoul (KR); Tae-yon Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 71 days.

(21) Appl. No.: 12/285,449

(22) Filed: Oct. 6, 2008

(65) Prior Publication Data

US 2009/0179185 A1    Jul. 16, 2009

(30) Foreign Application Priority Data

Jan. 11, 2008    (KR) ................. 10-2008-0003524

(51) Int. Cl.
*H01L 29/02* (2006.01)
(52) U.S. Cl. ... 257/2; 257/3; 257/4; 257/5; 257/E29.002; 438/102; 438/103; 365/163
(58) Field of Classification Search .................. 257/1–5, 257/E29.002; 438/102–103; 365/163
See application file for complete search history.

(56) References Cited

U.S. PATENT DOCUMENTS

2006/0011942 A1*  1/2006  Kim et al. ............... 257/192
2008/0068879 A1*  3/2008  Ahn et al. ............... 365/163

* cited by examiner

*Primary Examiner* — Jami M Valentine
(74) *Attorney, Agent, or Firm* — Harness, Dickey & Pierce, PLC

(57) ABSTRACT

A phase change material layer includes antimony (Sb) and at least one of indium (In) and gallium (Ga). A phase change memory device includes a storage node including a phase change material layer and a switching device connected to the storage node. The phase change material layer includes Sb and at least one of In and Ga.

15 Claims, 14 Drawing Sheets
(3 of 14 Drawing Sheet(s) Filed in Color)

PHASE CHANGE MATERIAL LAYERS AND PHASE CHANGE MEMORY DEVICES INCLUDING THE SAME

PRIORITY STATEMENT

This application claims priority under 35 U.S.C. §119 to Korean Patent Application No. 10-2008-0003524, filed on Jan. 11, 2008, in the Korean Intellectual Property Office, the entire contents of which are incorporated herein by reference.

BACKGROUND

Description of the Related Art

Conventional phase change random access memories (PRAMs) are characterized by a phase change material layer of a storage node in which data are stored.

A conventional phase change material layer has crystalline and amorphous states, and may be reversibly switched between the two states. When the phase change material layer is in the crystalline state, the resistivity of the phase change material layer is lower than when the phase change material layer is in the amorphous state. Data are stored in a PRAM using the difference in resistance of the phase change material layer in the crystalline relative to the amorphous states.

Conventionally, a PRAM includes a phase change material layer and a switching structure connected to the phase change material layer. The switching structure may be a diode or transistor. For example, a PRAM may include a transistor formed on a silicon wafer, a lower electrode contact layer connected to source and drain regions of the transistor, and a phase change material layer.

In example operation, when an electric pulse is applied to the phase change material layer, the phase change material layer is locally heated and changes into a crystalline or amorphous state. The phase change is proportional to how much the phase change material layer is heated. The resistivity of the phase change material layer varies according to the phase change. Because different current or voltage values may be obtained according to a variation in the resistivity of the phase change material layer, binary data may be written to and read from conventional PRAM.

A conventional phase change material layer may be formed of a GST (GeSbTe, such as $Ge_2Sb_2Te_5$) based material. GST, which is also referred to as a "chalcogenide" material may also be used for optical recording mediums such as DVDs, CD-RWs and the like.

An operating speed of a conventional PRAM may be determined by the rate at which the phase change material layer changes phases. Conventional GST requires a set time of about 100 nanoseconds (ns) or more to write data. As a result, fabricating relatively high-speed memory devices using GST is relatively difficult.

SUMMARY

Example embodiments relate to phase change material layers and phase change memory devices including the same. Phase change material layers according to at least some example embodiments may have a lower melting point, a higher recrystallization point, and/or improved retention characteristics as a result of reduced reset current.

Example embodiments provide phase change materials layer having improved data retention characteristics and/or a faster phase change rate as compared to conventional phase change materials such as GST (Ge—Sb—Te).

Example embodiments also provide phase change memory devices including a phase change material layer having improved data retention characteristics.

At least one example embodiment provides a phase change material layer including antimony (Sb) and at least one of indium (In) and gallium (Ga).

At least one other example embodiment provides a phase change memory device including a storage node and a switching device connected to the storage node. The storage node may include a phase change material layer. The phase change material layer may include Sb and at least one of In and Ga.

According to at least some example embodiments, the phase change material layer may have a ratio of Sb to at least one of Ga and In in a range from an intermetallic composition ratio to a eutectic composition ratio.

According to at least one example embodiment, the phase change material layer may include Sb and In, for example, $In_xSb_{1-x}$ (wherein, about $0.32 \leq x \leq$ about 0.50). According to at least one other example embodiment, the phase change material layer may include Sb and Ga, for example, $Ga_ySb_{1-y}$ (wherein, about $0.1 \leq y \leq$ about 0.50). According to at least one other example embodiment, the phase change material layer may include In, Ga, and Sb, for example, $(In, Ga)_zSb_{1-z}$ (wherein, about $0.12 \leq z \leq$ about 0.50).

According to at least some example embodiments, the switching device may be a transistor and the lower electrode may be electrically connected to one of a source and a drain region of the transistor structure. The phase change memory device may further include an interlayer insulation layer and a conductive plug. The interlayer insulation layer may cover upper and side surfaces of a gate and upper surfaces of the source and drain portions of the transistor. A conductive plug may be formed in a hole through the insulation layer. The conductive plug may electrically connect the lower electrode to the source or drain region of the transistor.

According to at least some example embodiments, the storage node may include a lower electrode electrically connected to the phase change material layer via a lower electrode contact layer and an upper electrode formed on the phase change material layer. An interlayer insulation layer may be formed between the phase change material layer and the lower electrode. The lower electrode contact layer may be formed within a hole through the interlayer insulation layer.

BRIEF DESCRIPTION OF THE DRAWINGS

The patent or application file contains at least one drawing executed in color. Copies of this patent or patent application publication with color drawing will be provided by the Office upon request and payment of the necessary fee.

The present invention will become more apparent by describing in detail example embodiments thereof with reference to the attached drawings in which.

DETAILED DESCRIPTION OF EXAMPLE EMBODIMENTS

Figure 1:
FIG. 1 is a cross-sectional diagram illustrating a phase change material layer according to an example embodiment.

Various example embodiments will now be described more fully with reference to the accompanying drawings in which some example embodiments are shown. In the drawings, the thicknesses of layers and regions are exaggerated for clarity.

Detailed illustrative example embodiments are disclosed herein. However, specific structural and functional details disclosed herein are merely representative for purposes of describing example embodiments. This invention may, however, may be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Phase change material layers and phase change memory devices including the phase change material layer will now be described more fully with reference to the accompanying drawings, in which example embodiments of the invention are shown. In the drawings, the thicknesses of layers and regions are exaggerated for clarity.

FIG. 1 is a cross-sectional diagram illustrating a phase change material layer according to an example embodiment.

Referring to FIG. 1, phase change material layer 10 may be formed of a binary or ternary compound including antimony (Sb) and at least one of gallium (Ga) and Indium (In). The composition of the binary or ternary compound may be between a eutectic composition ratio and an intermetallic composition ratio. For example, the phase change material layer 10 may be formed of a binary compound such as $In_xSb_{1-x}$ (wherein, about $0.32 \leq x \leq$ about 0.50) or $Ga_ySb_{1-y}$ (wherein, about $0.12 \leq y \leq$ about 0.50), or a ternary compound such as $(In, Ga)_zSb_{1-z}$ (wherein, about $0.12 \leq z \leq$ about 0.50).

When In—Sb has an intermetallic or eutectic composition ratio, the melting point temperature $T_m$ of the In—Sb may be between about 490° C. and about 500° C., inclusive. When Ga—Sb has an intermetallic or eutectic composition ratio, the melting point temperature Tm of the Ga—Sb is about 580° C. According to example embodiments, the melting point temperatures of the In—Sb and Ga—Sb are lower than about 620° C., which is the melting point temperature of GST. Therefore, example embodiments of the phase change material layer 10 formed of In—Sb, Ga—Sb, or (In, Ga)Sb may have a lower reset current as compared with conventional phase change material layers formed of GST, for example.

According to at least this example embodiment, a phase change material layer 10 may be formed by chemical vapor deposition (CVD), physical vapor deposition (PVD), atomic layer deposition (ALD) or the like. In an example embodiment in which the phase change material layer 10 is formed by sputtering, a Sb target and an In target or a Ga target may be independently used (co-sputtered). Alternatively, an In—Sb, Ga—Sb, or In—Ga—Sb alloy target may be used.

Figure 2:
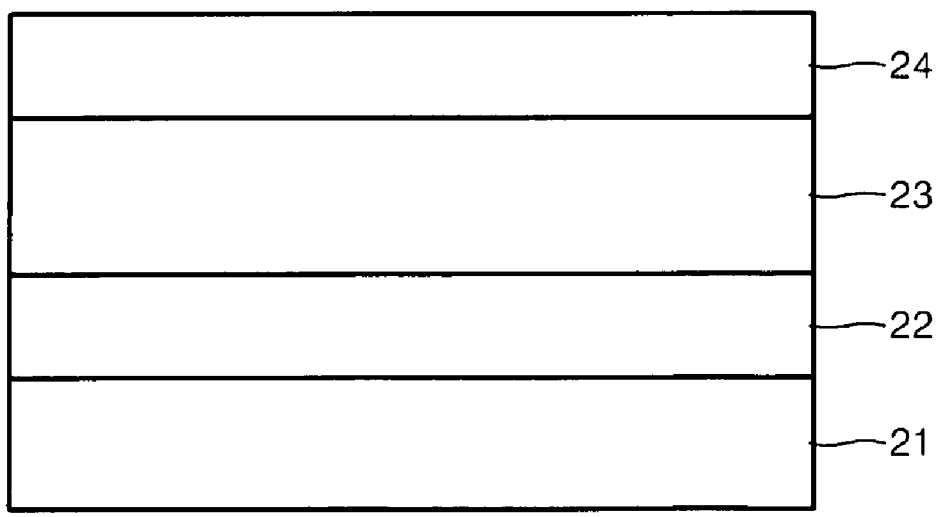
FIG. 2 is a cross-sectional diagram illustrating a phase change memory device including a phase change material layer according to an example embodiment.

FIG. 2 is a cross-sectional diagram illustrating a phase change memory device including a phase change material layer according to an example embodiment.

Referring to FIG. 2, a lower electrode 22 may be formed on a switching structure 21. A phase change material layer 23 and an upper electrode 24 may be formed sequentially on the lower electrode 22. The phase change material layer 23 may be the same or substantially the same as the phase change material layer 10 illustrated in FIG. 1. The switching structure 21 may be a diode, transistor or any other switching device.

Figure 3:
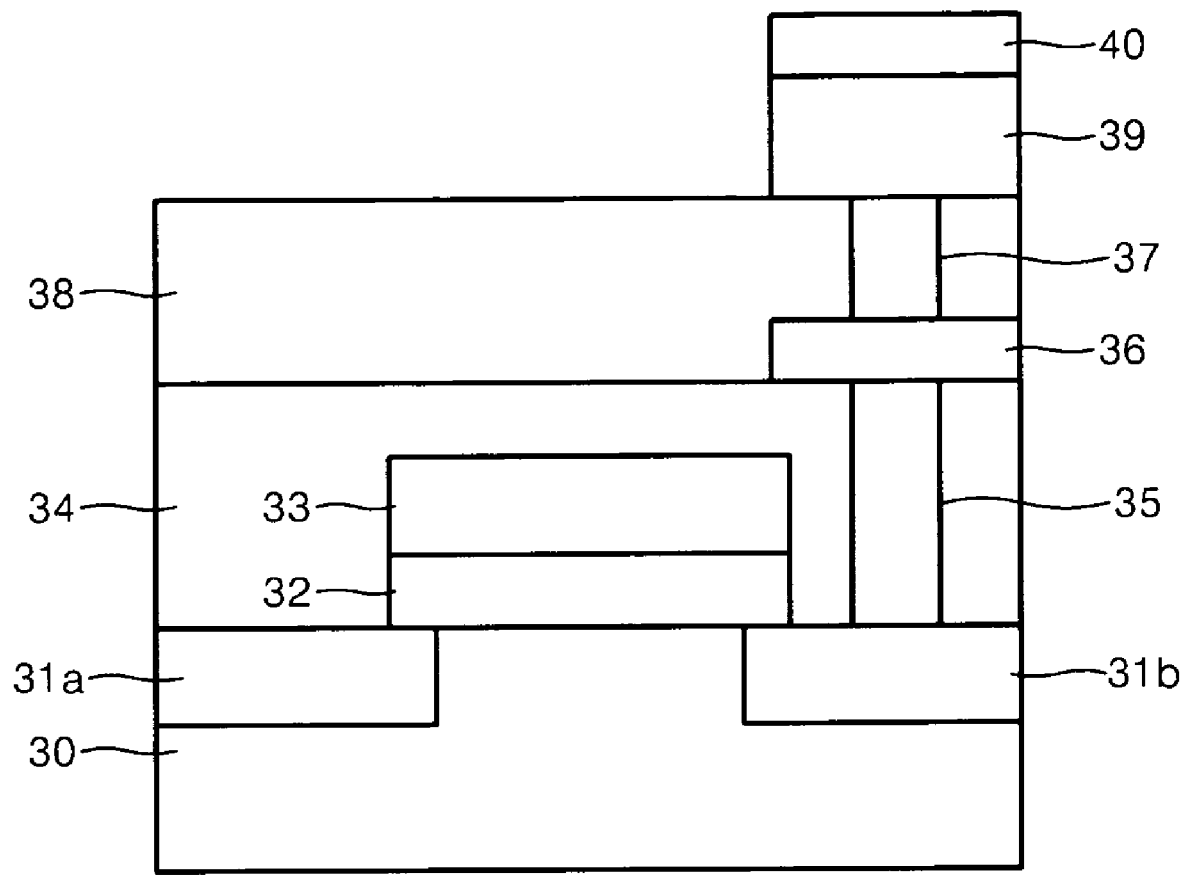
FIG. 3 is a cross-sectional diagram illustrating a phase change memory device including a phase change material layer according to another example embodiment.

FIG. 3 is a cross-sectional diagram illustrating a phase change memory device including a phase change material layer according to another example embodiment. In the example embodiment shown in FIG. 3, a transistor may be formed as a switching structure.

Referring to FIG. 3, a gate insulation layer 32 and a gate electrode 33 may be formed sequentially on a substrate 30. The substrate 30 may include a first impurity region 31a and a second impurity region 31b. A first interlayer insulation layer 34 may be formed on the substrate 30 and the gate electrode 33. The first interlayer insulation layer 34 may cover the exposed upper surface of the substrate 30, the upper surface of the gate electrode 33, the side surfaces of the gate insulation layer 32 and the gate electrode 33. A conductive plug 35 may be formed in the first interlayer insulation layer 34. The conductive plug 35 may be formed by forming a hole through the first interlayer insulation layer 34 to expose the second impurity region 31b, and filling the hole with a conductive material. Alternatively, the conductive plug 35 may be formed in a similar or substantially similar manner on the first impurity region 31a. A lower electrode 36 and a lower electrode contact layer 37 may be formed on the conductive plug 35. The lower electrode 36 may be formed of, for example, TiN, TiAlN or the like. The lower electrode contact layer 37 may be formed of the same or substantially the same material as the lower electrode 36. A second interlayer insulation layer 38 may be formed on the first interlayer insulation layer 34. A phase change material layer 39 and an upper electrode 40 may be formed sequentially on the lower electrode contact layer 37.

In the phase change memory device shown in FIG. 3, the lower electrode 36, the lower electrode contact layer 37, the phase change material layer 39, and the upper electrode 40 may constitute a storage node. However, in alternative example embodiments, the structure of the storage node may be changed. The phase change material layer 39 may correspond to the phase change material layer 10 shown in FIG. 1. The phase change material layer 39 may be formed of a binary or ternary compound including Sb and at least one of Ga and In.

According to example embodiments, the phase change material layer may include chalcogenide alloys such as, tin-indium-antimony-tellurium (Sn—In—Sb—Te), arsenic-germanium-antimony-tellurium (As—Ge—Sb—Te), a combination thereof, or the like.

Alternatively, the chalcogenide alloy of the phase change material layer may be selected from a binary phase-change chalcogenide alloy or a quaternary phase-change chalcogenide alloy. Example binary phase-change chalcogenide alloys may include one or more of Ga—Sb, Ga—In, Ga—Sb—In, a combination thereof, or the like.

Figure 4A:
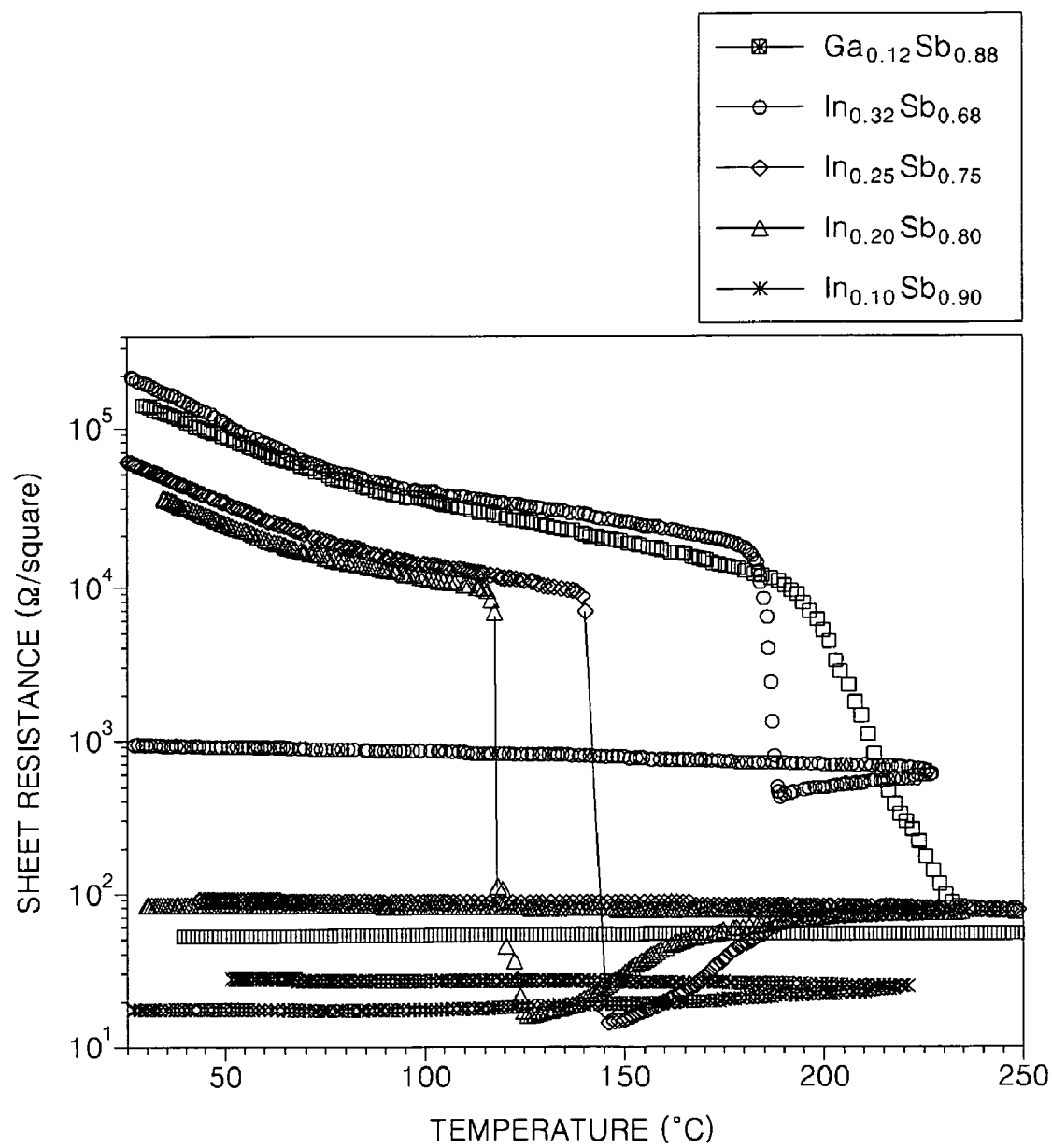
FIG. 4A is a resistivity-temperature graph of Ga—Sb and In—Sb having different composition ratios according to example embodiments.

FIG. 4A is a resistivity-temperature graph of example embodiments of Ga—Sb and In—Sb samples having different compositions. Referring to FIG. 4A, the resistivities of Ga—Sb and In—Sb decrease relatively largely as temperature increases due to the phase transformation of the Ga—Sb and In—Sb from an amorphous state to a crystalline state. Samples other than an $In_{0.1}$—$Sb_{0.90}$ sample have a ratio of amorphous state resistivity to crystalline state resistivity in the range of about $10^2$ to about $10^3$, inclusive. For example, except for the $In_{0.1}$—$Sb_{0.90}$ sample, each sample has a sensing margin sufficient for use in a phase change memory device. When In—Sb has less than 32 atomic % of In (a eutectic concentration), the crystallization temperature $T_c$ of In—Sb is lower than about 160° C., which is the temperature at which GST is crystallized. When the In—Sb has about 32 or more atomic % of In (e.g., when the In—Sb composition has an In concentration greater than or equal to the eutectic concentration), the In—Sb may have improved characteristics over conventional GST.

Figure 4B:
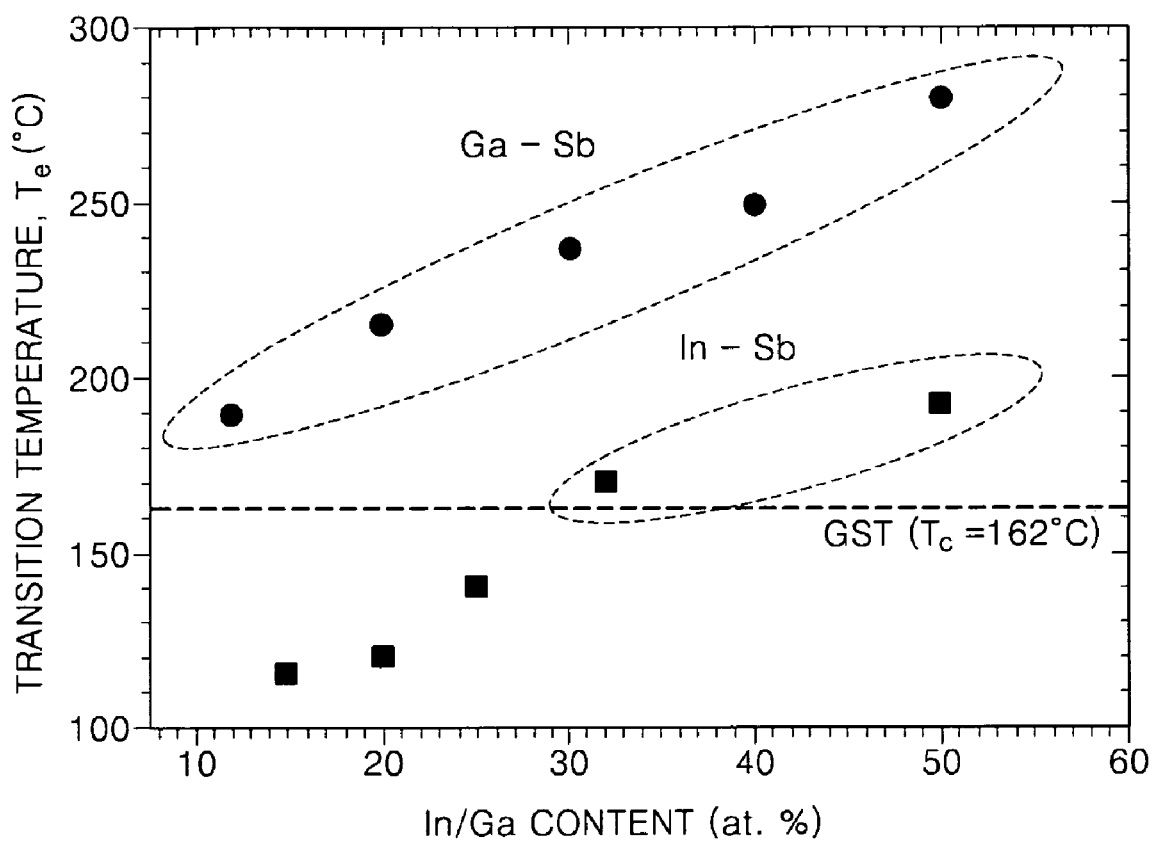
FIG. 4B is a graph showing a relationship between transition temperature and composition of a phase change material layer according to example embodiments.

FIG. 4B is a graph showing a relationship between transition temperature and composition of a phase change material layer according to an example embodiment. In FIG. 4B, the horizontal axis denotes a ratio of Ga or In to Sb, and the vertical axis denotes transition temperature (crystallization temperature).

Referring to FIG. 4B, when Ga—Sb samples have a Ga concentration of between about 12 atomic % (eutectic concentration) and about 50 atomic % (intermetallic concentration), inclusive, the Ga—Sb samples have crystalline temperatures higher than about 162° C., which is the temperature at which GST crystallizes. When In—Sb samples have an In concentration of between about 32 atomic % and about 50 atomic %, inclusive, the In—Sb samples have crystalline temperatures higher than the crystalline temperature of GST.

Figure 4C:
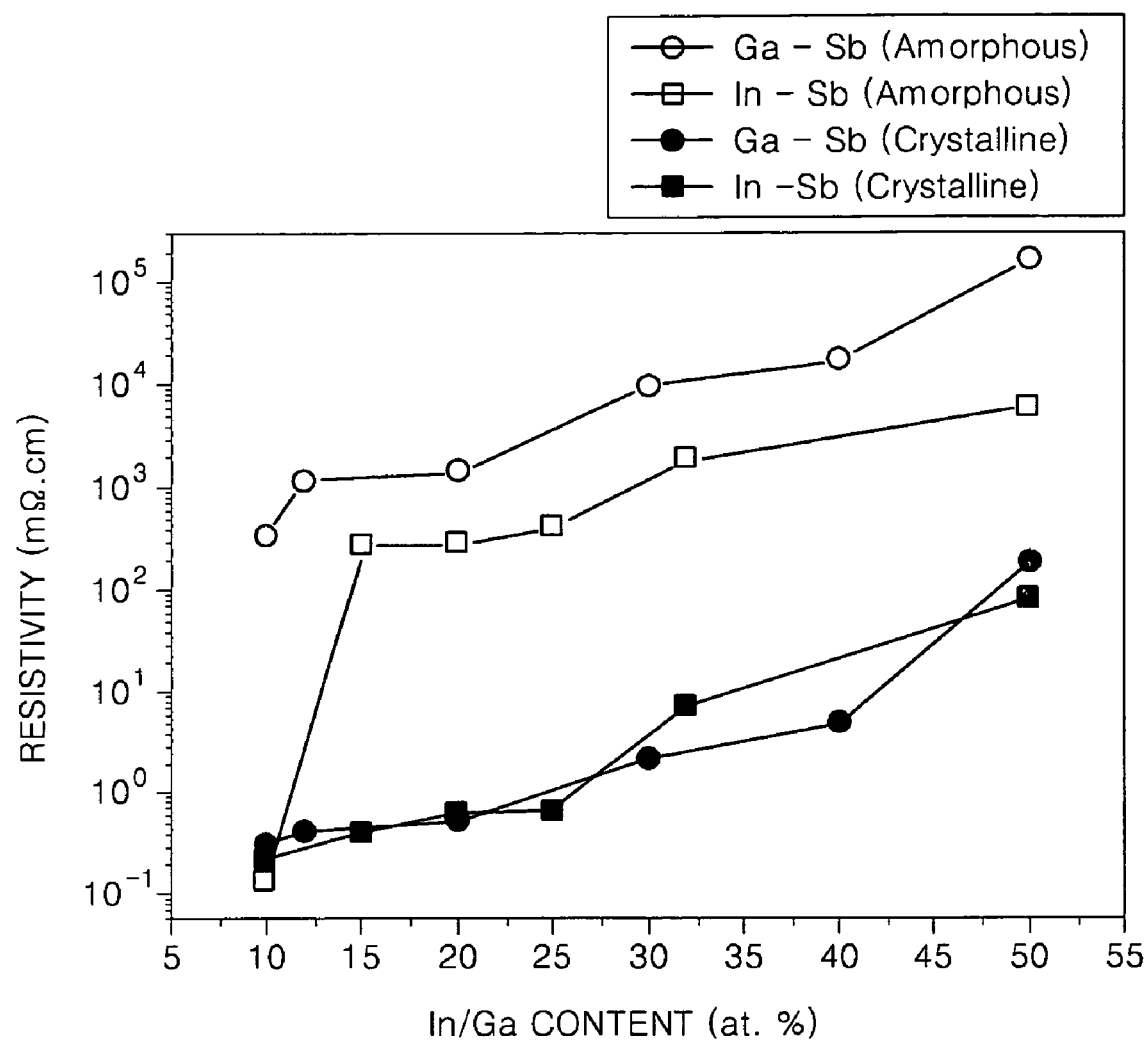
FIG. 4C is a graph showing resistivities of In—Sb and Ga—Sb in amorphous and crystalline states with respect to In and Ga contents (atomic %) according to example embodiments.

FIG. 4C is a graph showing resistivities of example embodiments of In—Sb and Ga—Sb compositions in amorphous and crystalline states with respect to In/Ga content (atomic %). Referring to FIG. 4C, as the In/Ga content increases, the resistivities of the In—Sb and Ga—Sb increase in both the amorphous and crystalline states. If the In/Ga content increases greater than an intermetallic concentration, the resistivities of the In—Sb and Ga—Sb in amorphous state increase greater than 100 mΩ·cm (about twenty or more times the resistivity of GST). In this example, due to the increase in resistivity of the phase change material layer, the sensing margin of the phase change memory device may decrease (e.g., relatively largely).

According to example embodiments, the In or Ga content of In—Sb or Ga—Sb may be adjusted to be greater than the eutectic concentration, but lower than the intermetallic concentration.

Figure 5A:
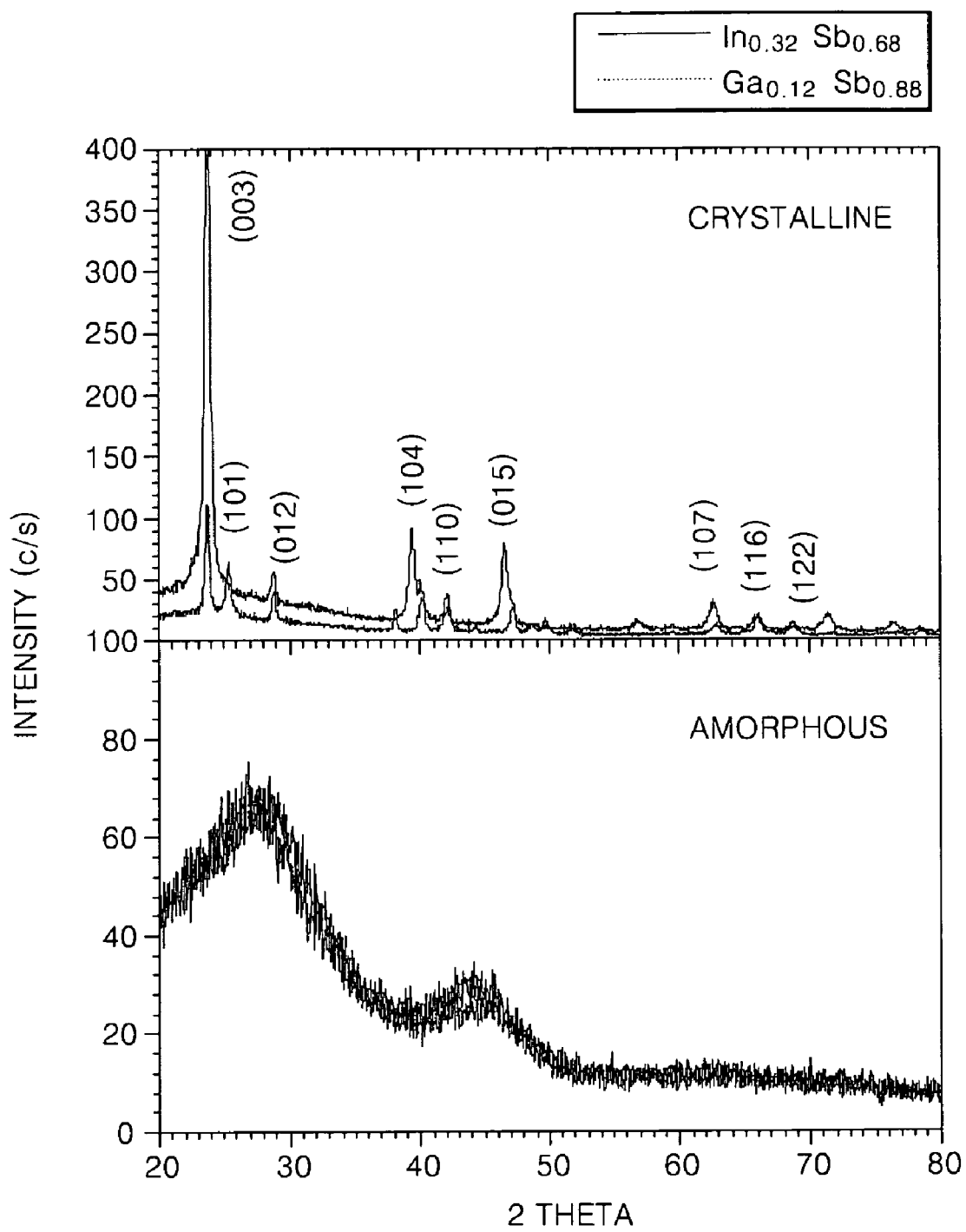
FIGS. 5A and 5B are X-ray-diffraction (XRD) graphs of phase change material layers according to example embodiments.
Figure 5B:
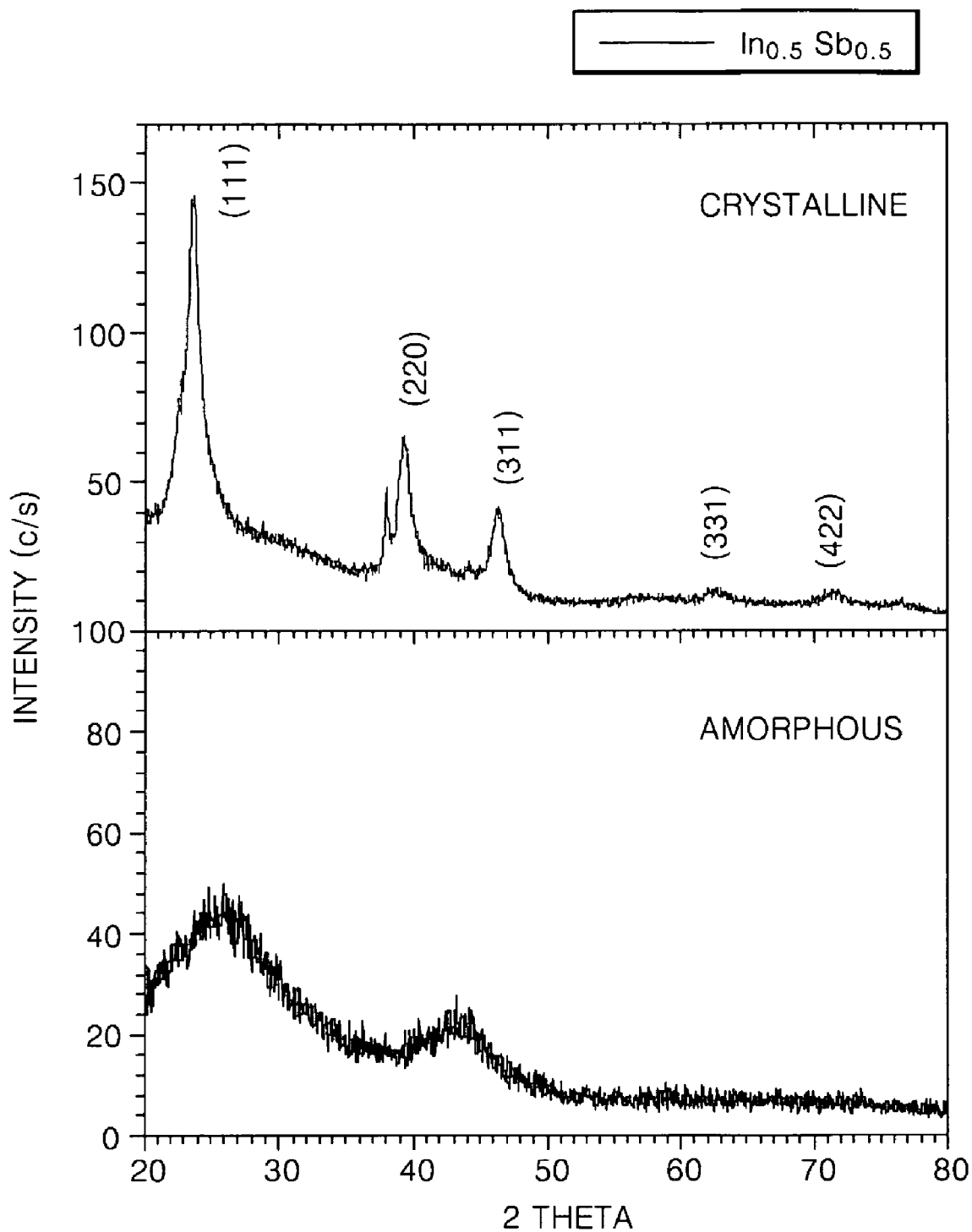

FIGS. 5A and 5B are X-ray-diffraction (XRD) graphs of phase change material layers according to example embodiments. In FIG. 5A, XRD curves of $In_{0.32}Sb_{0.68}$ and $Ga_{0.12}Sb_{0.88}$ layers in crystalline and amorphous states are shown. In FIG. 5B, XRD curves of $In_{0.5}Sb_{0.5}$ layers in crystalline and amorphous states are shown. When the phase change material layers change from an amorphous state to a crystalline state, rhombohedral crystalline structures are present in the $In_{0.32}Sb_{0.88}$ and $Ga_{0.12}Sb_{0.88}$ layers of FIG. 5A having the eutectic concentrations, whereas cubic structures are present in the $In_{0.5}Sb_{0.5}$ layers of FIG. 5B having the intermetallic concentration.

Figure 6A:
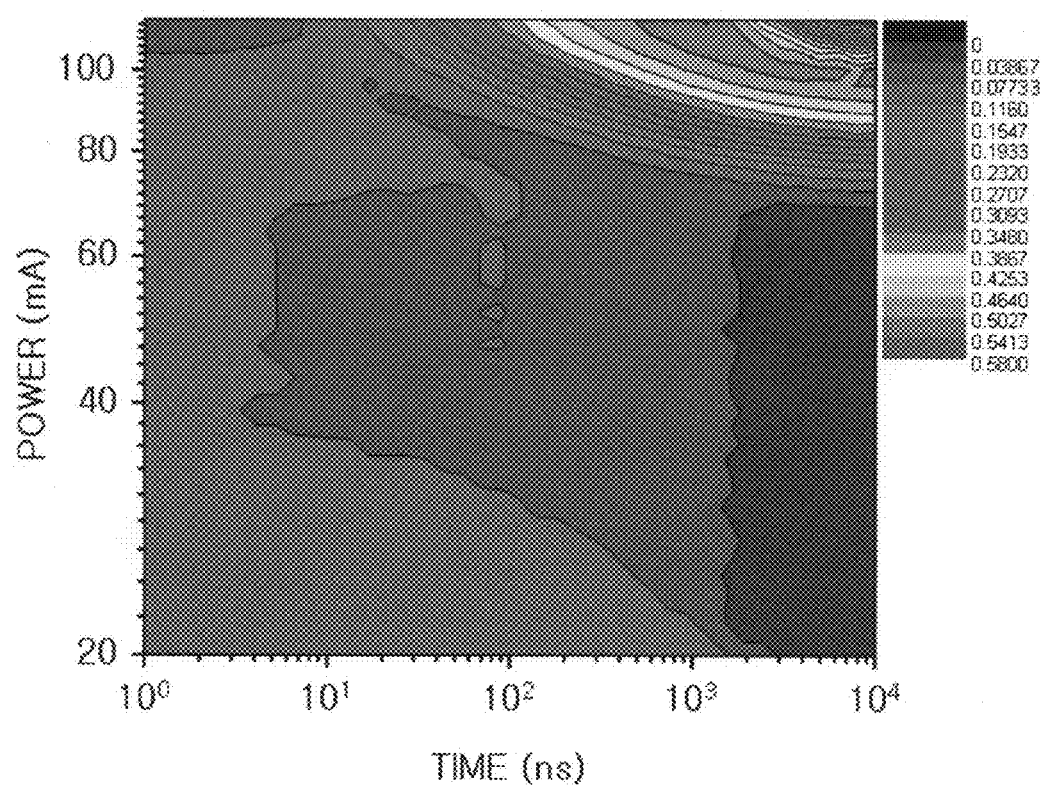
FIGS. 6A through 6C power-time-effect (PET) diagrams of phase change material layers according to example embodiments.
Figure 6B:
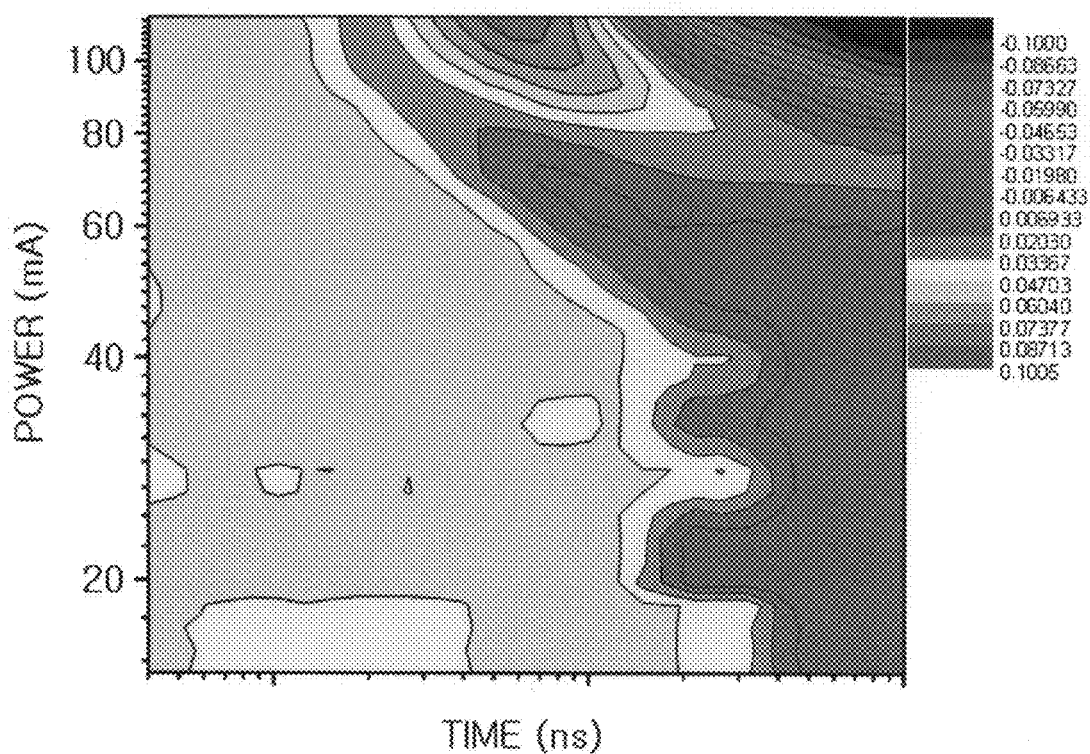
Figure 6C:
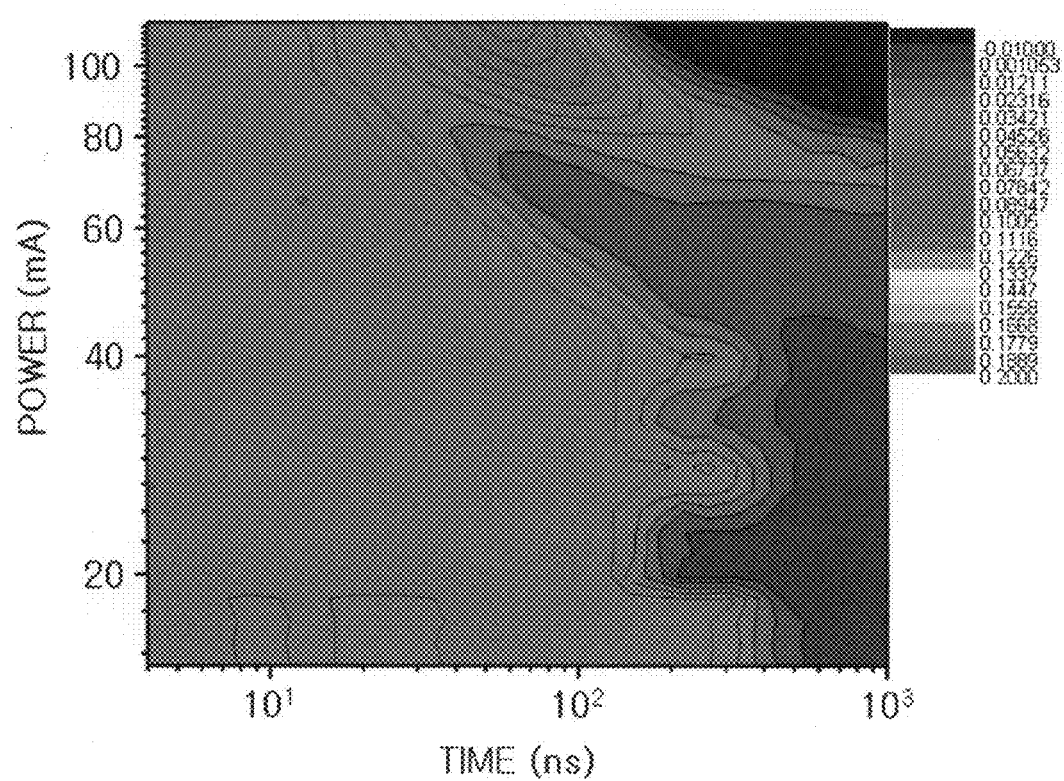

FIGS. 6A through 6C power-time-effect (PTE) diagrams of phase change material layers according to example embodiments. To obtain the experimental results shown in FIGS. 6A through 6C, laser light having a 650-nm wavelength was irradiated toward phase change material layers to observe phase change behaviors. In FIGS. 6A through 6C, the horizontal axis denotes time, whereas the vertical axis denotes power (applied current). FIG. 6A is a PTE diagram of an $In_{0.32}Sb_{0.68}$ layer, and FIG. 6B is a PTE diagram of a $Ga_{0.20}Sb_{0.80}$ layer. FIG. 6C is a PTE diagram of a $Ga_{0.50}Sb_{0.50}$ layer.

Time intervals 7 ns, 50 ns, and 50 ns were necessary for respective phase change material layers of FIGS. 6A, 6B, and 6C to change from an amorphous state to a crystalline state. In this example, set times of the phase change material layers were relatively short at about 50 ns or less as compared with the set time of a GST layer, which is about 150 ns.

Figure 7A:
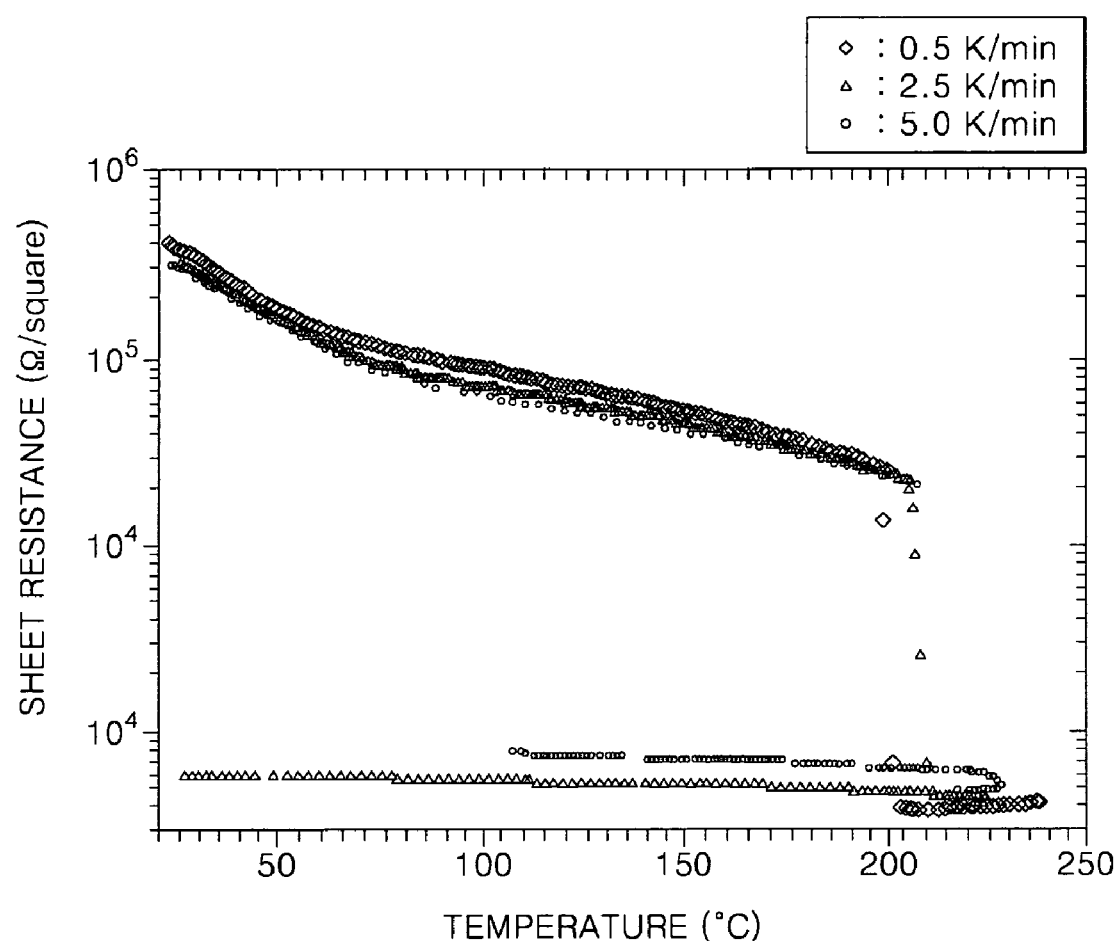
FIGS. 7A and 7B are graphs illustrating phase transformation behaviors of In—Ga—Sb according to example embodiments.
Figure 7B:
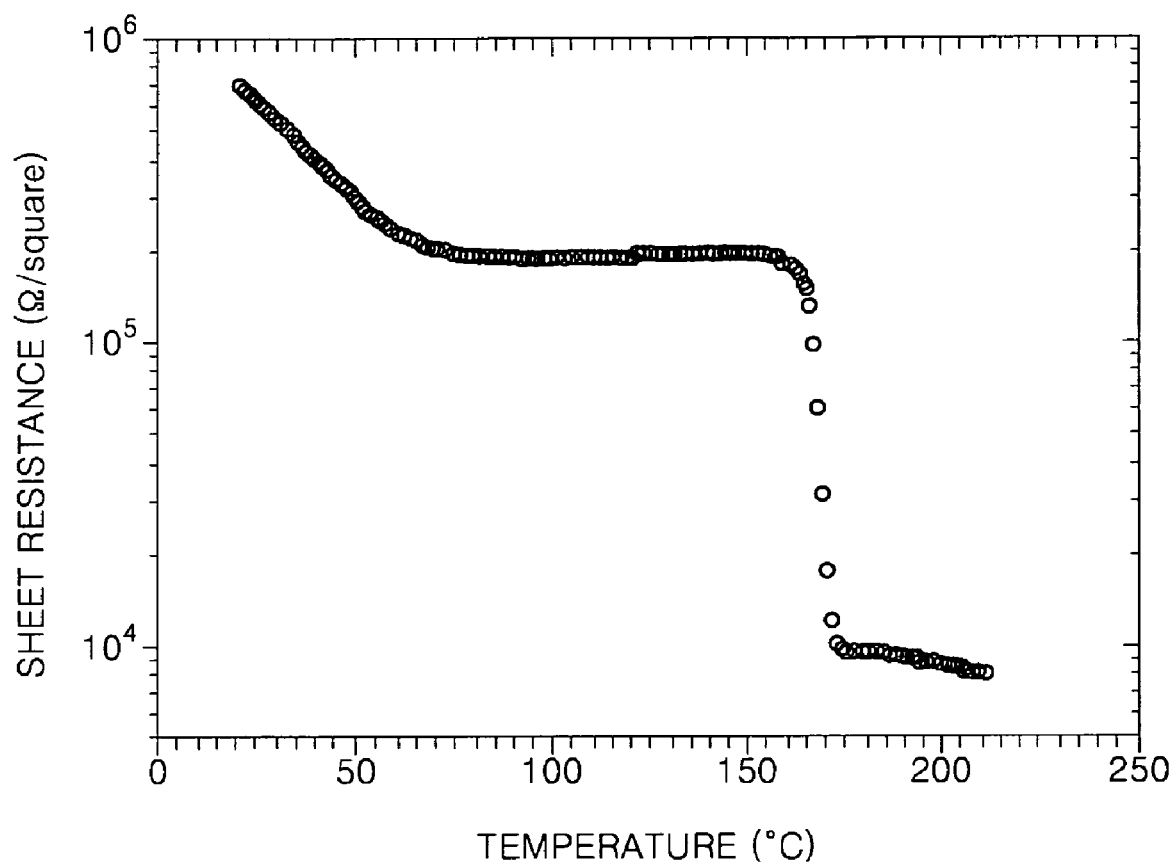

FIGS. 7A and 7B are graphs illustrating phase transformation behaviors of In—Ga—Sb. In FIGS. 7A and 7B, the horizontal axis denotes temperature and the vertical axis denotes resistance. FIG. 7A shows phase transformation behaviors of an $In_{0.22}Ga_{0.10}Sb_{0.68}$ sample, and FIG. 7B shows phase transformation behaviors of an $In_{0.25}Ga_{0.25}Sb_{0.5}$ sample.

Referring to FIG. 7A, the $In_{0.22}Ga_{0.10}Sb_{0.68}$ sample has a eutectic composition ratio. The crystallization temperature of the $In_{0.22}Ga_{0.10}Sb_{0.68}$ sample is about 220° C. The $In_{0.22}Ga_{0.10}Sb_{0.68}$ sample has an amorphous resistance/crystalline resistance ratio of about $10^2$ and a relatively high (e.g., good) sensing margin. Referring to FIG. 7B, the $In_{0.25}Ga_{0.25}Sb_{0.5}$ sample has an intermetallic composition ratio. The crystallization temperature of the $In_{0.25}Ga_{0.25}Sb_{0.5}$ sample is about 170° C. The $In_{0.25}Ga_{0.25}Sb_{0.5}$ sample has an amorphous resistance/crystalline resistance ratio of about $10^2$ and a relatively high (e.g., good) sensing margin.

Figure 8A:
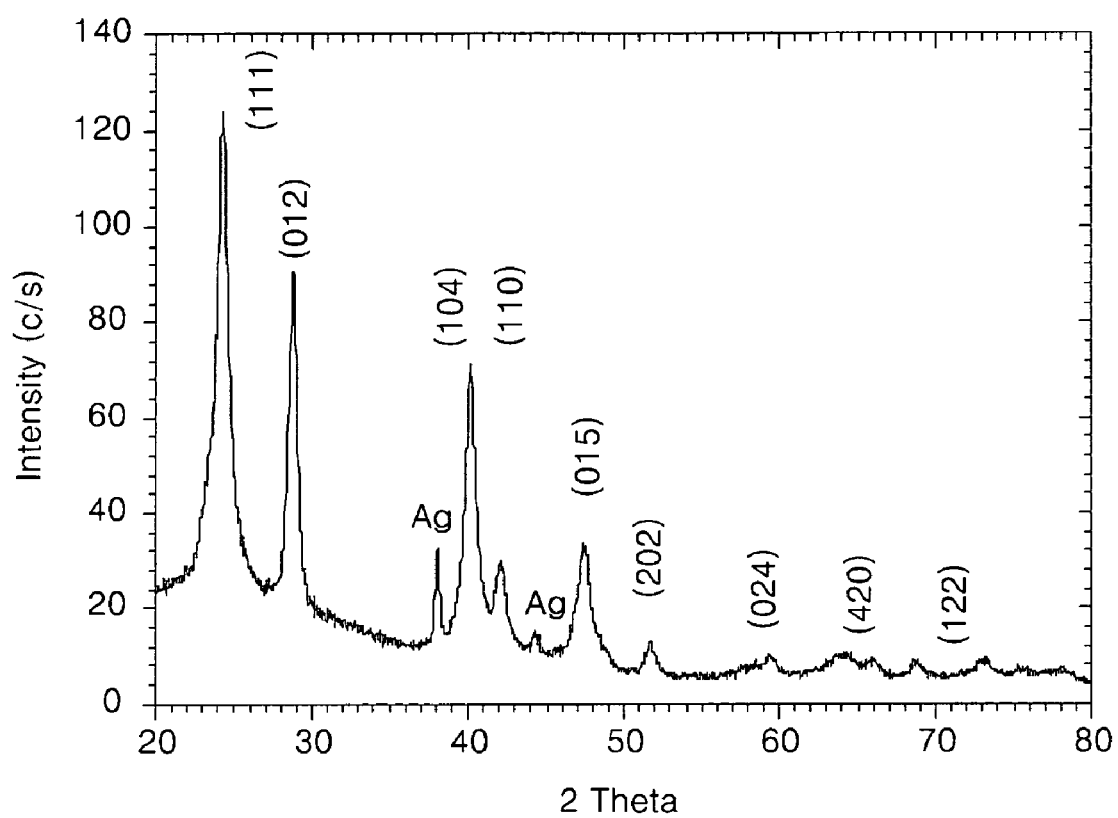
FIGS. 8A and 8B are XRD graphs of $In_{0.22}Ga_{0.10}Sb_{0.68}$ and $In_{0.25}Ga_{0.25}Sb_{0.5}$ in a crystalline state according to example embodiments.
Figure 8B:
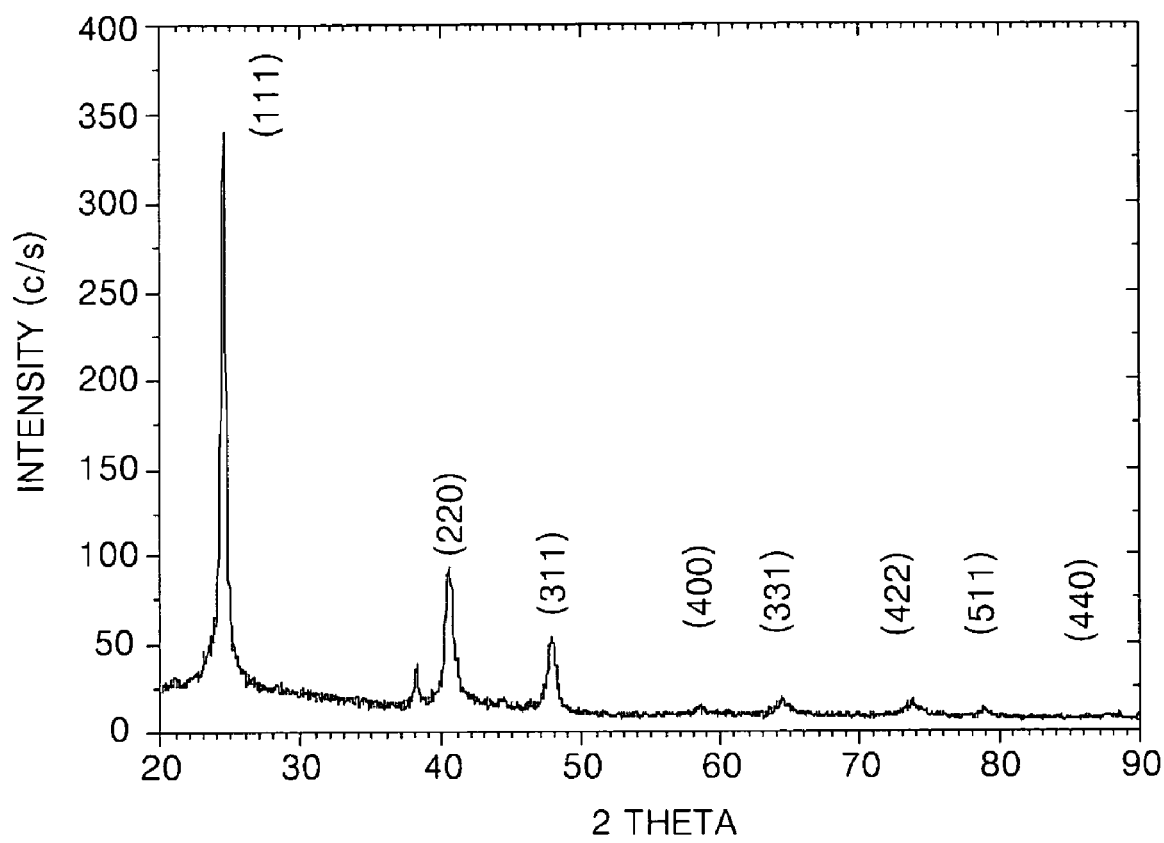

FIGS. 8A and 8B are XRD graphs of $In_{0.22}Ga_{0.10}Sb_{0.68}$ and $In_{0.25}Ga_{0.25}Sb_{0.5}$ compositions in a crystalline state. Referring to FIG. 8A, $In_{0.22}Ga_{0.10}Sb_{0.68}$ having a eutectic composition ratio has a rhombohedral crystalline structure, whereas $In_{0.25}Ga_{0.25}Sb_{0.5}$ having an intermetallic composition ratio has a cubic crystalline structure.

According to example embodiments, phase change material layers may be formed of In—Sb, Ga—Sb, or In—Ga—Sb. The composition of the phase change material layers may range from a eutectic composition ratio to an intermetallic composition ratio. Phase change material layers according to example embodiments may have a relatively low melting point and/or relatively high crystallization point. As a result, the reset current of phase change memory devices according to example embodiments may be reduced, while remaining more thermally stable. Furthermore, phase change memory devices may have a relatively high sensing margin and/or relatively high set speed. In addition, phase change memory devices may have relatively high programming speeds and/or improved data retention characteristics.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. A phase change material layer comprising:
antimony (Sb), indium (In) and gallium (Ga),
wherein a composition ratio of the antimony (Sb), indium (In) and gallium (Ga) is in a range from an intermetallic composition ratio to a eutectic composition ratio.

2. The phase change material layer of claim 1, wherein the phase change material layer includes $(In, Ga)_zSb_{1-z}$ (where, $0.12 \leq z \leq 0.50$).

3. A phase change memory device comprising:
a storage node including the phase change material layer of claim 1; and
a switching device connected to the storage node.

4. The phase change memory device of claim 3, wherein the phase change material layer includes $(In, Ga)_zSb_{1-z}$ (where, $0.12 \leq z \leq 0.50$).

5. A phase change memory device, comprising:
a storage node including a phase change material layer, the phase change material layer including antimony (Sb) and at least one of indium (In) and gallium (Ga); and
a switching device connected to the storage node,
wherein the switching device is a transistor and a lower electrode of the storage node is electrically connected to one of a source and a drain region of the transistor, and
a composition ratio of the antimony (Sb) to the at least one of indium (In) and gallium (Ga) is in a range from an intermetallic composition ratio to a eutectic composition ratio.

6. The phase change memory device of claim 5, further comprising:
an interlayer insulation layer covering upper and side surfaces of a gate of the transistor and upper surfaces of the source and drain regions of the transistor; and
a conductive plug formed in a hole through the insulation layer, the conductive plug electrically connecting the lower electrode to the source or drain region of the transistor.

7. The phase change memory device of claim 3, wherein the storage node further includes,
a lower electrode electrically connected to the phase change material layer via a lower electrode contact layer; and
an upper electrode formed on the phase change material layer.

8. The phase change material device of claim 7, further comprising:
an interlayer insulation layer formed between the phase change material layer and the lower electrode, the lower electrode contact layer being formed within a hole through the interlayer insulation layer.

9. The phase change memory device of claim 5, wherein the phase change material layer includes Sb and In.

10. The phase change memory device of claim 9, wherein the phase change material layer includes $In_xSb_{1-x}$ (where, $0.32 \leq x \leq 0.50$).

11. The phase change memory device of claim 5, wherein the phase change material layer includes Sb and Ga.

12. The phase change memory device of claim 11, wherein the phase change material layer includes $Ga_ySb_{1-y}$ (where, $0.12 \leq y \leq 0.50$).

13. The phase change memory device of claim 5, wherein the phase change material layer includes In, Ga, and Sb.

14. The phase change memory device of claim 13, wherein the phase change material layer includes $(In, Ga)_zSb_{1-z}$ (where, $0.12 \leq z \leq 0.50$).

15. A phase change memory device, comprising:
a storage node including a phase change material layer, the phase change material layer including antimony (Sb) and at least one of indium (In) and gallium (Ga); and
a switching device connected to the storage node,
wherein the storage node includes a lower electrode electrically connected to the phase change material layer via a lower electrode contact layer and an upper electrode formed on the phase change material layer, and
a composition ratio of the antimony (Sb) to the at least one of indium (In) and gallium (Ga) is in a range from an intermetallic composition ratio to a eutectic composition ratio.

* * * * *